United States Patent [19]

Hayashi

[11] Patent Number: 5,453,387

[45] Date of Patent: Sep. 26, 1995

[54] FABRICATION METHOD OF SEMICONDUCTOR DEVICE WITH NEIGHBORING N- AND P- TYPE REGIONS

[75] Inventor: Shigeru Hayashi, Tokyo, Japan

[73] Assignee: NEC Corporation, Tokyo, Japan

[21] Appl. No.: 354,794

[22] Filed: Dec. 12, 1994

[30] Foreign Application Priority Data

Dec. 13, 1993 [JP] Japan .................................. 5-311429

[51] Int. Cl.[6] ....................... H01L 21/266; H01L 21/761
[52] U.S. Cl. .................. 437/27; 437/31; 437/75; 437/953; 437/28; 437/34
[58] Field of Search ................... 437/27, 31, 38, 437/75, 149, 150, 953; 148/DIG. 18

[56] References Cited

U.S. PATENT DOCUMENTS

| | | | |
|---|---|---|---|
| 4,346,512 | 8/1982 | Liang et al. | 437/953 |
| 5,023,191 | 6/1991 | Sakurai | 437/27 |
| 5,023,195 | 6/1991 | Sekikawa et al. | 437/27 |
| 5,397,714 | 3/1995 | De Jong et al. | 437/31 |

FOREIGN PATENT DOCUMENTS 1-225155  9/1989  Japan .

*Primary Examiner*—Chandra Chaudhari
*Attorney, Agent, or Firm*—Young & Thompson

[57] ABSTRACT

A fabrication method of a semiconductor device that can form n- and p-type buried regions separately in a semiconductor substrate of a first conductivity type through a single lithography process. A first impurity of a second conductivity type is doped into the substrate through a first window to produce a first doped region of the second conductivity type. A second impurity of the second conductivity type is doped into the substrate through a second window larger than the first window to produce a second doped region of the second conductivity type. The second doped region is placed under the unoverlapped part of the first and second windows and lower in impurity concentration than the first doped region. A third impurity of the first conductivity type is doped into the substrate through its surface area containing the second window to produce a third doped region of the first conductivity type. The third doped region is lower in impurity concentration than the first doped region. The second doped region with the second and third impurities acts as a separation region for electrically separating the first and third doped regions.

9 Claims, 4 Drawing Sheets

FIG. IA
PRIOR ART
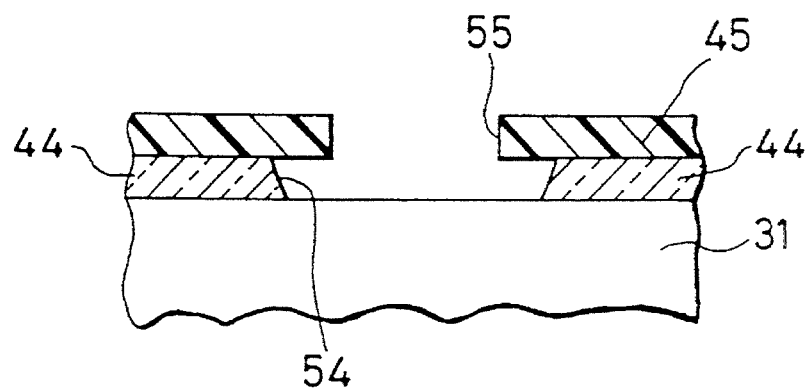
FIG. IB
PRIOR ART
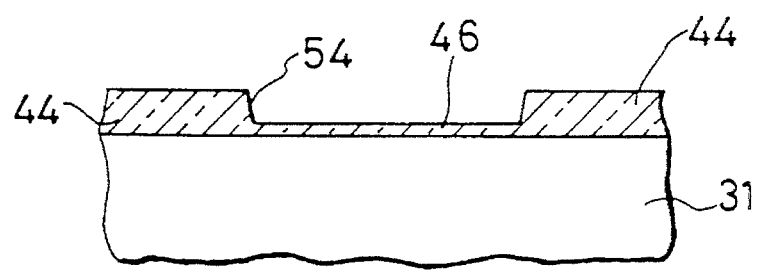
FIG. IC
PRIOR ART
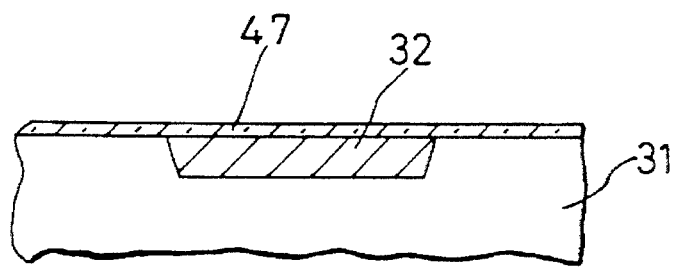
FIG. ID
PRIOR ART
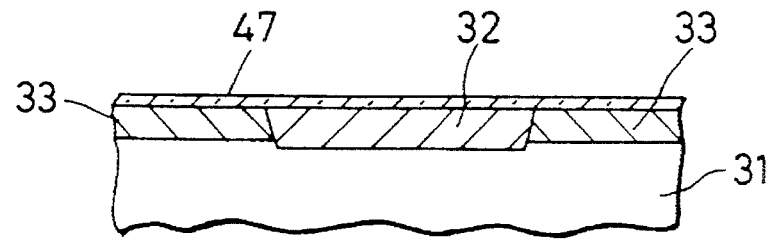

FABRICATION METHOD OF SEMICONDUCTOR DEVICE WITH NEIGHBORING N- AND P- TYPE REGIONS

BACKGROUND OF THE INVENTION

1. Field of the Invention

The present invention relates to a fabrication method of a semiconductor device and more particularly, to a fabrication method of a semiconductor device with neighboring n- and p-type regions formed in a semiconductor substrate, which is applicable to fabrication of bipolar transistors on a semiconductor integrated circuit device.

2. Description of the Prior Art

In recent years, with fabrication of a semiconductor integrated circuit device containing bipolar transistors, several researches and developments have been made into formation of $n^+$- and $p^+$-type buried regions in the same process step so that the number of photolithography processes is reduced to unity.

A conventional method of this sort thus developed is shown in 1A to 1D and a semiconductor integrated circuit device fabricated by this method is shown in FIG. 2.

In this method, first, as shown in FIG. 1A, a silicon dioxide ($SiO_2$) film 44 with a thickness of 500 to 1000 nm is formed on a p-type semiconductor substrate 31. Then, a photoresist film 45 is formed on the $SiO_2$ film 44 and is patterned to have a rectangular window 55 by a photolithography process.

Using the photoresist film 45 thus patterned as a mask, the $SiO_2$ film 44 is selectively removed through a wet etching process using hydrofluoric acid, so that another rectangular window 54 is formed in the film 44, as shown in FIG. 1A. The window 54 is larger than the window 55 to contain the window 55 therein.

Next, the photoresist film 45 is removed and then, the substrate 31 is oxidized in the window 54 so that a thin $SiO_2$ film 46 with a thickness of 30 to 50 nm is selectively formed on the exposed part of the substrate 31, as shown in FIG. 1B.

Using the $SiO_2$ film 44 with the window 54 as a mask, ionized arsenic (As) atoms are selectively implanted into the substrate 31 through the thin $SiO_2$ film 46 in the window 54 with a dose of about $5\times10^{15}$ $cm^{-2}$, which is termed a first ion-implantation process. The substrate 31 thus arsenic-implanted is then annealed at a temperature of about 1140° C. for about 210 minutes to diffuse the doped arsenic atoms, so that the atoms will be electrically active. The arsenic atoms thus implanted and diffused form an $n^+$-type buried region 32 inside the substrate 31, as shown in FIG. 1C. The region 32 is rectangular in plan shape corresponding to the window 54.

After the $SiO_2$ film 44 and 46 are removed entirely from the substrate 31 by a wet etching process, a thin $SiO_2$ film 47 is formed again on the substrate 31 to cover the buried region 32, as shown in FIG. 1C.

Then, ionized boron (B) atoms are implanted into the entirety of the substrate 31 through the thin $SiO_2$ film 47 with a dose of about $5\times10^{13}$ $cm^{-2}$, which is termed a second ion-implantation process. The dose of the process is much lower than that of the first ion-implantation process.

The substrate 31 thus boron-implanted is then annealed at a temperature of about 1000° C. for about 60 minutes to diffuse the boron atoms, so that the atoms will be electrically active. The boron atoms thus implanted and diffused form a $p^+$-type buried region 33 inside the substrate 31, as shown in FIG. 1D. Since the boron atoms are implanted into the entirety of the substrate 31, the $p^+$-type buried region 33 is formed to be overlaid with the $n^+$-type buried region 32.

Thus, the $n^+$-type buried region 32 is subjected to the above boron implantation. However, since the boron implantation is sufficiently low in dose or doping concentration compared with the arsenic implantation, the $n^+$-type buried region 32 is scarcely affected by the boron implantation. Therefore, the $n^+$-type buried region 32 remains as it was, and the resultant $p^+$-type buried regions 33 is produced outside the $n^+$-type buried region 32 so as to surround the region 32, as shown in FIG. 1D.

After the $SiO_2$ film 47 is removed, an $n^-$-type epitaxial layer 34 is grown on the surface of the substrate 31 to cover the $n^+$- and $p^+$-type buried regions 32 and 33, as shown in FIG. 2.

Then, in the epitaxial layer 34, a $p^+$-type diffusion region 43 as a channel stop is selectively formed along the $p^+$-type buried region 33 to be contacted with the region 33.

After a field $SiO_2$ film 35 for lateral isolation is selectively formed on the epitaxial layer 34, a $p^+$-type extrinsic base region 36 and a p-type intrinsic base region 37 of an npn-type bipolar transistor are selectively formed in the epitaxial layer 34 to be contacted with each other, as shown in FIG. 2. The both base regions 36 and 37 are in contact with the field $SiO_2$ film 35, respectively, and are placed over the $n^+$-type buried region 32.

An $n^+$-type emitter region 38 of the transistor is formed in the epitaxial layer 34 to be surrounded by the intrinsic base region 37. The part of the epitaxial layer 34 under the intrinsic base regions 37 act as a collector region of the transistor.

A first dielectric film 40a is formed on the exposed epitaxial layer 34 and the field $SiO_2$ film 35. Then, a polysilicon film 39 as an emitter contact is selectively formed on the film 40a. The polysilicon film 39 is in contact with the emitter region 38 through a contact hole of the film 40a.

A second dielectric film 40b is formed on the first dielectric film 40a and the polysilicon film 39, and a third dielectric film 40c is formed on the second dielectric film 40b.

A metal film is then deposited on the third dielectric film 40c and is patterned to make an emitter electrode 41 and a base electrode 42. The emitter electrode 41 is in contact with the polysilicon film 39 through contact holes of the second and third dielectric films 40b and 40c. The base electrode 42 is in contact with the extrinsic base region 36 through contact holes of the first, second and third dielectric films 40a, 40b and 40c.

A collector electrode (not shown) is also formed on the third dielectric film 40c to be in contact with the epitaxial layer 34 as the collector region through contact holes of the first, second and third dielectric films 40a, 40b and 40c.

Thus, the conventional npn-type bipolar transistor shown in FIG. 2 is obtained. The $n^+$-type buried region 32 has an action to reduce the collector resistance. On the other hand, the $p^+$-type buried region 33 has an action to electrically separate the $n^+$-type buried region 32 from an $n^+$-type buried region (not shown) of another bipolar transistor adjacent to this transistor concerned. With the bipolar transistor fabricated by the above conventional method, the $n^+$-type buried region 32 is positioned closely to the $p^+$-type buried region 33 in the substrate 31 and the epitaxial layer 34. Therefore, when the layout or positional arrangement of the field $SiO_2$ film 35 and the n⁺-type buried region 32 is designed with a slight or no margin of stacking error, the edge of the p⁺-type extrinsic base region 36, which is defined by the boundary of the field SiO₂ film 35, will be formed closely to the opposing edge of the p⁺-type buried region 33, as shown in FIG. 2. As a result, there is a problem that electric-current leak or short tends to occur between the p⁺-type extrinsic base region 36 and the p⁺-type buried regions 33, which remarkably reduces the fabrication yield of the bipolar transistor.

To solve the problem, as shown in FIG. 3, the n⁺-type buried region 32 may be designed to be laterally expanded so that the above margin of stacking error between the edge of the p⁺-type extrinsic base region 36 and the opposing edge of the p⁺-type buried region 33 becomes sufficiently large.

In this case, however, there arises another problem that the collector capacitance tends to increase with the expansion in area of the n⁺-type buried region 32, resulting in decrease in operation speed of the bipolar transistor.

SUMMARY OF THE INVENTION

Accordingly, an object of the present invention is to provide a fabrication method of a semiconductor device that enables to form neighboring n- and p-type regions in a semiconductor substrate without arising the above problems about the electric-current leak and the collector capacitance.

Another object of the present invention is to provide a fabrication method of a semiconductor device that enables to form neighboring n- and p-type regions in a semiconductor substrate in self-align without adding any lithography process therefor.

A fabrication method of a semiconductor device according to the invention contains the following steps of (a) to (h):

First, an insulator film is formed on a semiconductor substrate of a first conductivity type (step (a)). Then, a mask layer having a first window is formed on the insulator film (step (b)).

A second window is formed in the insulator film using the mask layer as a mask (step (c)). The second window has a central part in which the first window is reflected and a peripheral part formed to surround the central part.

Next, a first impurity of a second conductivity type is selectively doped into the substrate through a first surface area of the substrate using the mask layer as a mask to produce a first doped region of the second conductivity type (step (d)). The first surface area corresponds to the central part of the second window. The first doped region is placed under the central part and has a first impurity concentration.

The mask layer is then removed from the insulator film (step (e)).

Subsequently, a second impurity of the second conductivity type is selectively doped into the substrate through a second surface area of the substrate using the insulator film as a mask to produce a second doped region of the second conductivity type (step (f)). The second surface area corresponds to the central and peripheral parts of the second window. The second doped region is placed under the peripheral part of the second window and has a second impurity concentration lower than the first impurity concentration.

The insulator film is then removed from the substrate (step (g)).

A third impurity of the first conductivity type is doped into the substrate through a third surface area of the substrate to produce a third doped region of the first conductivity type (step (h)). The third surface area is larger than the second surface area and contains the second surface area therein. The third doped region is placed under the third surface area except for the second surface area and has a third impurity concentration lower than the first impurity concentration.

The second doped region doped with the second and third impurities act as a separation region for separating the first doped region from the third doped region.

As the first and second impurities, arsenic is preferably used; however, phosphorus (P) may be used. As the third impurity, boron is preferably used.

With the method of the present invention, because the second doped region is doped with the second and third impurities different in polarity from each other, carriers that contributes conductivity to the second doped region are restrained from generating in the second doped region, which is almost equivalent to a no-impurity doped region.

Therefore, the second doped region can act as a separation region for separating the first doped region from the third doped region. As a result, neighboring n- and p-type regions are formed by the first and third doped regions in the semiconductor substrate.

Additionally, such the separation region as above is produced between the first and third doped regions by the second doped region. Therefore, even if an additional doped region of the first conductivity type such as an external base region of a bipolar transistor is provided near the first doped region, there is a sufficient distance between the first doped region and the additional doped region. This means that no electric-current leak or short occurs between the first and additional doped regions.

Further, to ensure the separation between the first and third doped regions, the first region is not required to be expanded. Therefore, there is no possibility of increase in collector capacitance resulting in operation speed reduction of the semiconductor device.

Still further, because the separation region made by the second doped region is produced through the doping processes of the first, second and third impurities, neighboring n- and p-type regions are formed in self-align in the semiconductor substrate.

The third surface area of the substrate is preferably the entire surface of the substrate. In this case, the above neighboring n- and p-type regions can be formed through a single lithography process of the step (b). However, the third surface are is not always the entire surface and may be a limited area.

Preferably, arsenic ions are implanted into the substrate as the first impurity in the step of (d), arsenic ions are implanted into the substrate as the second impurity in the step of (f), and boron ions are implanted into the substrate as the third impurity in the step of (h).

The following step may be contained: In this step, an epitaxial layer of the second conductivity type is formed on the substrate to cover the first, second and third doped regions. This step is carried out after said step of (h). Thus, neighboring buried regions of the first and second conductivity types are produced in the vicinity of an interface of the substrate and the epitaxial layer.

In this case, the following step of may be further contained. In this step, a bipolar transistor is formed by using the epitaxial layer. A collector region of the transistor is formed in the epitaxial layer adjacent to the first doped region. The first doped region acts as a buried region for minimizing a series resistance of the collector region.

Preferably, the mask layer is a resist film, the first window is formed in the resist film by lithography, the insulator film is an inorganic compound film, and the second window is formed by isotropically etching the inorganic compound film as the insulator film.

The method may further contain the following heat-treatment step that is followed by the step of (g). In this step, a heat-treatment of the substrate is performed to diffuse the first and second impurities doped into the first and second doped regions.

In the most preferred case, the second impurity concentration is substantially equal to the third impurity concentration, because the doping effects of the first and second impurities are almost or completely cancelled with each other in the second doped region 21.

In a preferred case, the second impurity concentration $D_2$ and the third impurity concentration $D_3$ have a relationship as $0.1 \leq (D_2/D_3) \leq 10.0$. If out of this range, the collector capacitance becomes excessively large and/or the withstand voltage of the semiconductor device becomes excessively low.

BRIEF DESCRIPTION OF THE DRAWINGS

FIGS. 1A to 1D are partial cross-sectional views showing a conventional fabrication method of a semiconductor device, respectively.

DETAILED DESCRIPTION OF THE PREFERRED EMBODIMENTS

Figure 2:
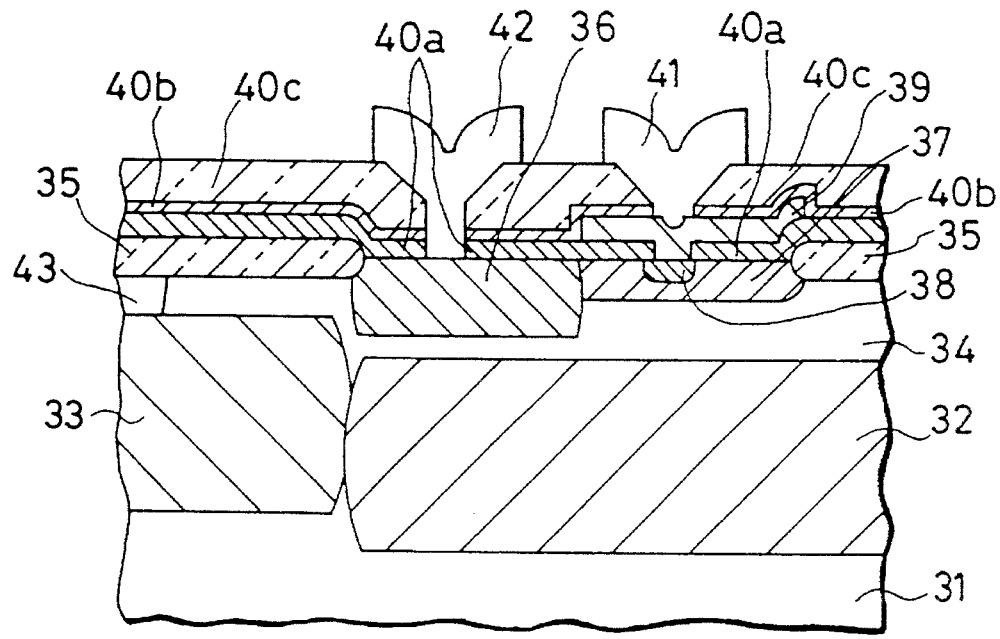
FIG. 2 is a partial cross-sectional view of a semiconductor device fabricated by the conventional method shown in FIGS. 1A to 1D.
Figure 3:
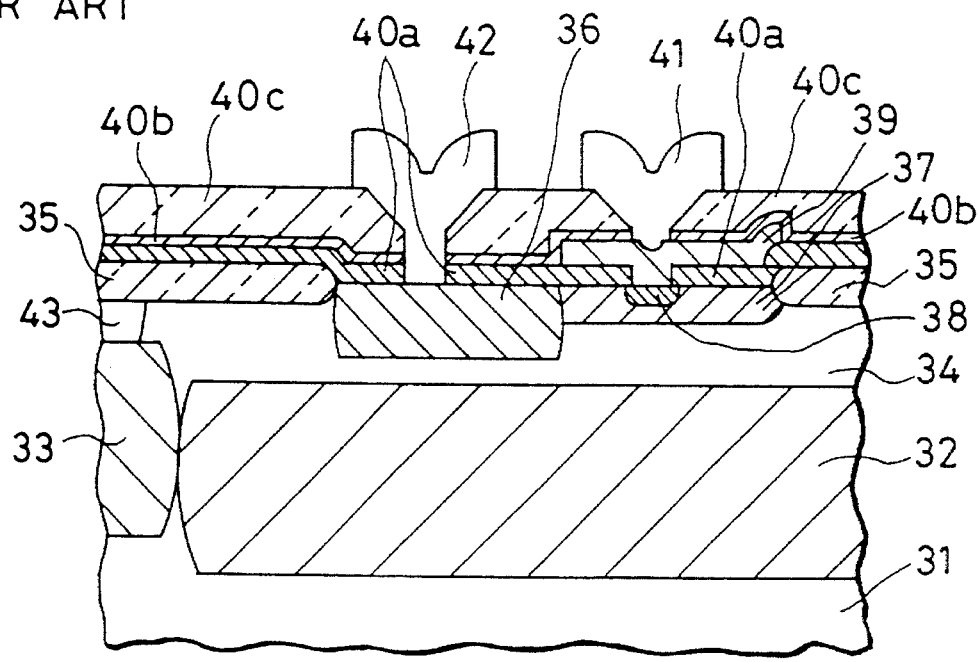
FIG. 3 is a partial cross-sectional view of another semiconductor device fabricated by another conventional fabrication method of a semiconductor device.

A preferred embodiment of the present invention will be described below referring to the drawings attached.

Figure 4A:
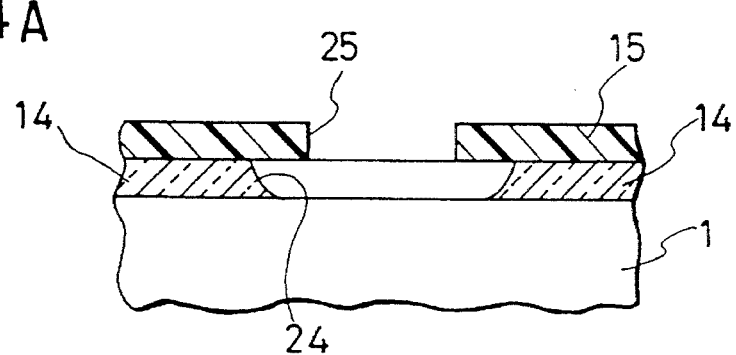
FIGS. 4A to 4D are partial cross-sectional views showing a fabrication method of a semiconductor device according to an embodiment of the present invention, respectively.

In a fabrication method of an embodiment of the invention, first, as shown in FIG. 4A, a $SiO_2$ film 14 with a thickness of 500 to 1000 nm is formed on a p-type single-crystal silicon (Si) substrate 1. Then, a photoresist film 15 is formed by coating on the $SiO_2$ film 14 and is patterned to have a first rectangular window 25 by a photolithography process. The first window 25 is used for forming an $n^+$-type buried region 16 with a relatively higher impurity concentration.

Using the photoresist film 15 thus patterned as a mask, the $SiO_2$ film 14 is selectively removed through a wet etching process using hydrofluoric acid, so that a second rectangular window 24 is formed in the film 14, as shown in FIG. 4A.

Since the $SiO_2$ film 14 is isotropically etched during the etching process, the film 14 is removed not only vertically but also laterally. Here, the film 14 is laterally etched away by 500 to 2000 nm, which means that the second window 24 has a wider area than that of the first window 25. Specifically, the second window 24 has a central part in which the first window 25 is reflected and a peripheral part formed to surround the central part.

Next, using the photoresist film 15 as a mask, ionized arsenic (As) atoms are selectively implanted into a region 20a of the substrate 1 through a first surface area 18 of the substrate 1 at an acceleration energy of 70 keV with a dose of about $5 \times 10^{15}$ cm$^{-2}$ which is termed a first ion-implantation process. The first surface area 18 has a rectangular shape corresponding to the first window 25. The photoresist film 15 is then removed.

Figure 4B:
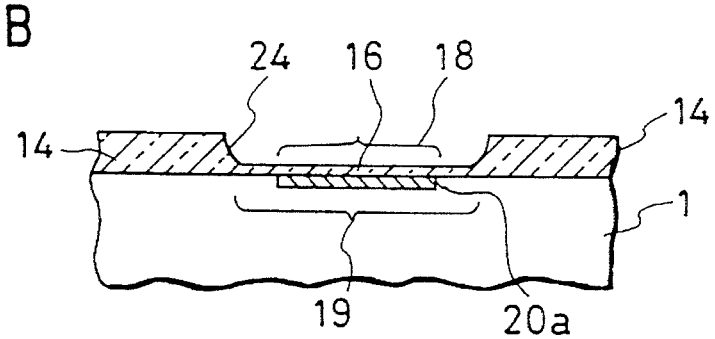

The substrate 1 thus arsenic-implanted is thermally oxidized so that a thin $SiO_2$ film 16 with a thickness of 30 to 50 nm is selectively formed on the exposed part of the substrate 1 in the second window 24, as shown in FIG. 4B.

Using the $SiO_2$ film 14 as a mask, ionized As atoms are selectively implanted into the substrate 1 through the $SiO_2$ film 16 in the second window 24 at an acceleration energy of 70 key with a dose of about $5 \times 10^{13}$ cm$^{-2}$, which is termed a second ion-implantation process. This ion-implantation is carried out through a second surface area 19 of the substrate 1. The second surface area 19 has a rectangular plan shape corresponding to the second window 24.

Although the dopant of the second implantation process is the same as that of the first ion-implantation process, the dose of the second one is 0.01 times as much as that of the first one, which is sufficiently lower than the latter.

Figure 4C:
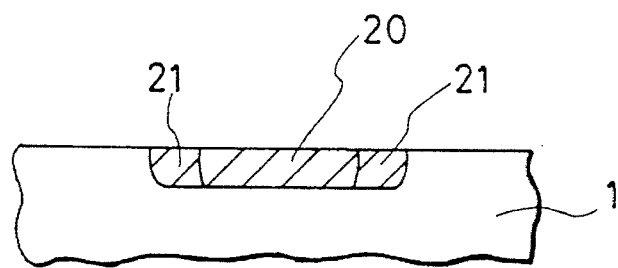

The substrate 1 thus arsenic-implanted twice is then annealed at a temperature of about 1140° C. for about 210 minutes to diffuse the arsenic atoms in the substrate, so that the atoms will be electrically active. The arsenic atoms thus implanted produces a first $n^+$-type buried region 20 with a relatively higher impurity concentration and a second $n^+$-type buried region 21 with a relatively lower impurity concentration in the substrate 1, as shown in FIG. 4C.

The first $n^+$-type buried region 20 is corresponding to the first surface area 18, i.e., the first window 25. The second $n^+$-type buried region 21 corresponds to the second surface area 19 except for the first surface area 18, i.e., the peripheral area of the second window 24. Therefore, the first $n^+$-type buried region 20 is entirely surrounded by the second $n^+$-type buried region 21. The second $n^+$-type buried region 21 is 500 to 2000 nm in width corresponding to the lateral etching amount of the $SiO_2$ film 14.

Then, the $SiO_2$ films 14 and 16 are removed entirely from the substrate 1 by a wet etching process. The state at this time is shown in FIG. 4C.

If the above annealing process is carried out after removal of the $SiO_2$ films 14 and 16, the doped arsenic atoms tends to diffuse outward through the second surface area 19 of the substrate 1, and they are doped again into any other region adjacent to the areas 18 and 19 such as a metal-oxide-semiconductor (MOS) field-effect transistor region and an isolation region formed at the same substrate 1 during later processes. As a result, unwanted diffusion or contamination of such the region will occur.

Accordingly, the $SiO_2$ films 14 and 16 are required for preventing the outdiffusion of the implanted arsenic atoms during the annealing process. Thus, these films 14 and 16 are removed after the above annealing process.

Figure 4D:
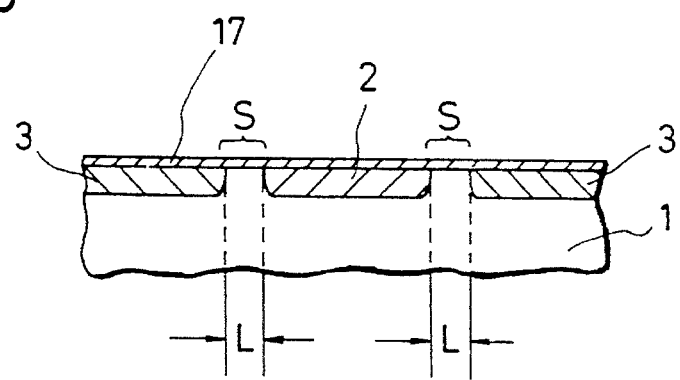

Subsequently, a thin $SiO_2$ film 17 with a thickness of 30 to 50 nm is formed on the entire surface of the substrate 1 to cover the first and second $n^+$-type buried regions 20 and 21, as shown in FIG. 4D. Then, ionized boron (B) atoms are implanted into the entirety of the substrate 1 through the thin SiO$_2$ film 17 at an acceleration energy of 100 keV with a dose of about 5×10$^{13}$ cm$^{-2}$, which is termed a third ion-implantation process. The boron atoms are doped through a third surface area of the substrate 1.

The substrate 1 thus boron-implanted is then annealed at a temperature of about 1000° C. for about 60 minutes to diffuse the boron atoms, so that the atoms will be electrically active. Thus, a p$^+$-type buried region 3 is formed in the substrate 1. The p$^+$-type buried region 3 is corresponding to the third surface area except for the second surface area 19, in other words, the p$^+$-type buried region 3 surrounds or contains the second n$^+$-type buried region 21 therein.

Thus, a first n$^+$-type buried region 2 is produced from the first n$^+$-type buried region 20 doped with arsenic twice at the same position, and a p$^+$-type buried region 3 is produced by the third ion-implantation process to surround the region 2.

Since the dose or impurity concentration of the p-type impurity, i.e., boron in the third ion-implantation process is sufficiently low compared with the sum of those of the n-type impurity, i.e., arsenic in the first and second ion-implantation processes, the first n$^+$-type buried region 2 is scarcely affected by the boron implantation.

On the other hand, because the dose or impurity concentration of arsenic in the second ion-implantation process is equal to that of boron in the third ion-implantation process, the doping effects of the boron and arsenic atoms are substantially cancelled with each other in the second n$^+$-type buried region 21. As a result, no carrier that contributes conductivity to the region 21 is generated, so that a separation region S of a rectangular shape is produced by the second n$^+$-type buried region 21, as shown in FIG. 4D.

In the separation region S, both of acceptor and donor levels are generated in the forbidden band due to the p- and n-type dopants, i.e., boron and arsenic atoms, respectively, and almost all of the electrons at the donor level are trapped by the acceptor level. Therefore, the electrons existing in the valence band are restrained from being excited to the acceptor level and at the same time, those existing at the donor level are also restrained from being excited into the conduction band. As a result, no or almost no carrier that contributes conductivity to the separation region S is generated, which enables electrical insulation between the p$^+$-type buried region 3 and a p$^{-+}$ type extrinsic base region described later.

If the width of the separation region S, i.e., a distance between the opposing edges of the n$^+$- and p$^+$-type buried regions 2 and 3 is defined as L, L is 500 to 2000 nm corresponding to the peripheral part of the second window 24.

To produce such the separation region S between the buried regions 2 and 3, in the embodiment, the dose or dopant concentration D$_{As}$, of arsenic and the dose or dopant concentration D$_B$ of boron are equal to each other. However, it is sufficient for this purpose that D$_{As}$, and D$_B$ have such a relationship as 0.1≦(D$_{As}$/D$_B$)<10.0, which is practical.

Figure 5:
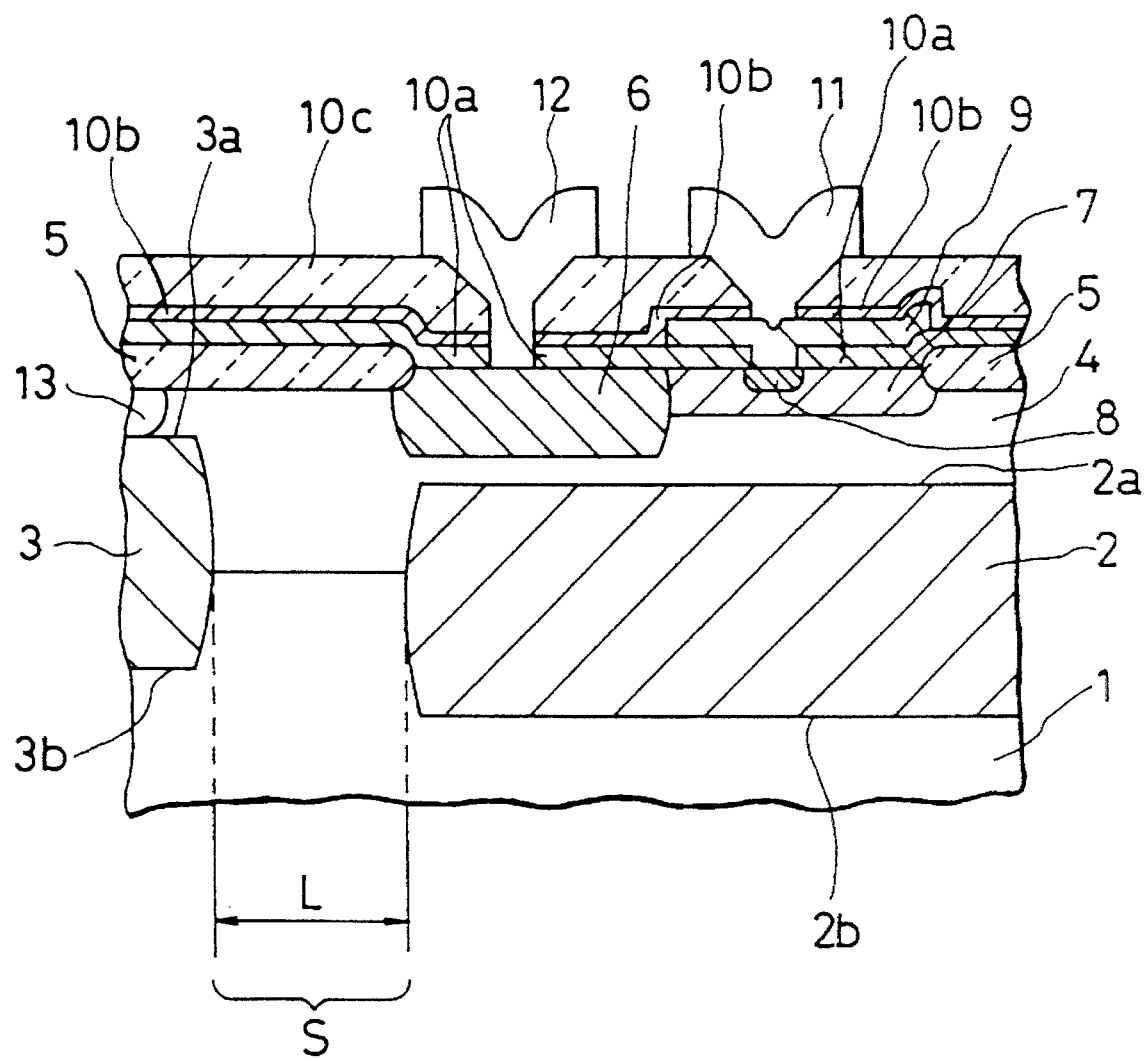
FIG. 5 is a partial cross-sectional view of a semiconductor device fabricated by the method of the embodiment shown in FIGS. 4A to 4D.

After the SiO$_2$ film 17 is removed from the substrate 1, an n$^-$-type epitaxial layer 4 is grown on the surface of the substrate 1, as shown in FIG. 5. The epitaxial layer 4 is 1.75±0.15 μm in thickness and is 1.05 to 1.4 μΩ.cm in resistivity. In the epitaxial layer 4, a p$^+$-type diffusion region 13 as a channel stop is selectively formed to be contacted with the p$^+$-type buried region 3.

A field SiO$_2$ film 5 for lateral isolation is then formed selectively on the epitaxial layer 4.

Subsequently, a p$^+$-type extrinsic base region 6 and a p-type intrinsic base region 7 of an npn-type bipolar transistor are selectively formed in the epitaxial layer 4 to be contacted with each other. The base regions 6 and 7 are in contact with the field SiO$_2$ film 5, respectively, and are placed over the n$^+$-type buried region 2.

An n$^+$-type emitter region 8 of the transistor is formed in the epitaxial layer 4 to be surrounded by the intrinsic base region 7. The part of the epitaxial layer 4 under the intrinsic base regions 7 act as a collector region of the transistor.

A first dielectric film 10a is formed on the field SiO$_2$ film 5 and the exposed epitaxial layer 4. Typically, the film 10a is an SiO$_2$ film deposited by CVD and is about 200 nm in thickness. A patterned polysilicon film 9 as an emitter contact is formed on the film 10a. The polysilicon film 9 is in contact with the emitter region 8 through a contact hole of the film 10a.

A second dielectric film 10b is selectively formed on the first dielectric film 10a to cover the polysilicon film 9.

Typically, the film 10b is an SiO$_2$ or Si$_3$N$_4$ film deposited by CVD and is about 100 nm in thickness.

A third dielectric film 10c is formed on the second dielectric film 10b. Typically, the film 10c is a BPSG or PSG film deposited by CVD and is about 500 nm in thickness.

A metal film is then deposited on the third dielectric film 10c and is patterned to make an emitter electrode 11 and a base electrode 12. The emitter electrode 11 is in contact with the polysilicon film 9 through contact holes of the second and third dielectric films 10b and 10c. The base electrode 12 is in contact with the extrinsic base region 6 through contact holes of the first, second and third dielectric films 10a, 10b and 10c.

A collector electrode (not shown) is also formed on the third dielectric film 10c to be in contact with the epitaxial layer 4 as the collector region through contact holes of the first, second and third dielectric films 10a, 10b and 10c.

Thus, the npn-type bipolar transistor shown in FIG. 5 is obtained.

As shown in FIG. 5, the bottom end 2b of the n$^+$-type buried region 2 is positioned deeper in the substrate 1 than the bottom end 3b of the p$^+$-type buried region 3. This is caused by the fact that the annealing process for the n-type buried region 2 (i.e., the first and second ion-implantation processes) is carried out at a higher temperature (1140° C.) for a longer period (210 minutes) than that (1000° C., 60 minutes) for the p$^+$-type buried region 3 (i.e., the third ion-implantation process). Additionally, this is also caused by the fact that the dose (5×10$^{15}$ cm$^{-2}$) of arsenic for the n -type buried region 2 is higher than that (5×10$^{13}$ cm$^{-2}$) for the p$^+$-type buried region 3.

Further, the top end 3a of the p$^+$-type buried region 3 is higher in the epitaxial layer 4 than the top end 2a of the n$^+$-type buried region 2, as shown in FIG. 5. This is caused by the fact that the diffusion coefficient of boron is larger than that of arsenic so that the diffusion amount of boron is more than that of arsenic during the epitaxial growth process of the n-type Si layer 4.

As described above, with the method of the embodiment, the n$^+$- and p$^+$-type buried regions 2 and 3 are formed separately in self-align in the semiconductor substrate 1 through a single lithography process shown in FIG. 4A.

Further, although the boundary of the n$^+$-type buried region 2 is designed to be positioned closely to the opposing boundary of the p$^+$-type buried regions 3 without margin of stacking error, the edge of the p⁺-type extrinsic base region 6 that is defined by the boundary of the field SiO$_2$ film 5 is positioned separately from the opposing edge of the p⁺-type buried region 3 due to the separation region S in the bipolar transistor actually fabricated in accordance with the design.

As a result, a sufficient positional margin of L (=500 to 2000 nm) is ensured to be produced between the p⁺-type buried region 3 and the p⁺-type extrinsic base region 6. This means that no electric-current leak or short occurs between the both regions 3 and 6.

In addition, there is no possibility of increase in collector capacitance because of no expansion of the n⁺-type buried region 2, avoiding operation speed reduction of the bipolar transistor.

In the embodiment, although the method is applied to fabrication of a bipolar transistor, it may be applied to any other device if it contains neighboring n- and p-type regions formed in the substrate.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, said method comprising the steps of:
    (a) forming an insulator film on a semiconductor substrate of a first conductivity type;
    (b) forming a mask layer having a first window on said insulator film;
    (c) forming a second window in said insulator film using said mask layer with said first window as a mask, said second window having a central part in which said first window is reflected and a peripheral part formed to surround said central part;
    (d) selectively doping a first impurity of a second conductivity type opposite in polarity to said first conductivity type into said substrate through a first surface area of the substrate using said mask layer with said first window as a mask to produce a first doped region of said second conductivity type,
        said first surface area corresponding to said central part of said second window, said first doped region being placed under said central part and having a first impurity concentration;
    (e) removing said mask layer from said insulator film after said step of (d);
    (f) selectively doping a second impurity of said second conductivity type into said substrate through a second surface area of said substrate using said insulator film as a mask to produce a second doped region of said second conductivity type,
        said second surface area corresponding to said central and peripheral parts of said second window, said second doped region being placed under said peripheral part of said second window and having a second impurity concentration $D_2$ lower than said first impurity concentration;
    (g) removing said insulator film from said substrate after said step of (f); and
    (h) doping a third impurity of said first conductivity type into said substrate through a third surface area of said substrate to produce a third doped region of said first conductivity type,
        said third surface area being larger than said second surface area and containing said second surface area therein, said third doped region being placed under said third surface area except for said second surface area and having a third impurity concentration $D_3$ lower than said first impurity concentration;
    wherein
        said second doped region is doped with said second and third impurities that restrain carrier generation in said second doped region, so that the second doped region acts as a separation region for separating said first doped region from said third doped region.

2. The method as claimed in claim 1, wherein arsenic ions are implanted into said substrate as said first impurity in said step of (d), arsenic ions are implanted into said substrate as said second impurity in said step of (f), and boron ions are implanted into said substrate as said third impurity in said step of (h).

3. The method as claimed in claim 1, further comprising the step of forming an epitaxial layer of said second conductivity type on said substrate to cover said first and third doped regions and said separation region after said step of (h).

4. The method as claimed in claim 3, further comprising the step of forming a bipolar transistor by using said epitaxial layer, wherein a collector region of said bipolar transistor is formed in said epitaxial layer adjacent to said first doped region, and said first doped region acts as a buried layer for minimizing a series resistance of said collector region.

5. The method as claimed in claim 1, wherein said mask layer is a resist film, said first window is formed in said resist film by lithography, said insulator film is an inorganic compound film, and said second window is formed by isotropically etching said inorganic compound film.

6. The method as claimed in claim 1, further comprising the step of forming a bipolar transistor by using said epitaxial layer;
    wherein a collector region of said bipolar transistor is formed in said epitaxial layer adjacent to said first doped region, and said first doped region acts as a buried layer for minimizing a series resistance of said collector region.

7. The method as claimed in claim 1, further comprising the step of performing a heat-treatment of said substrate to redistribute said first and second impurities in said first and second doped regions prior to said step of (g).

8. The method as claimed in claim 1, wherein said second impurity concentration is substantially equal to said third impurity concentration.

9. The method as claimed in claim 1, wherein said second impurity concentration $D_2$ and said third impurity concentration $D_3$ have a relationship as $0.1 \leq (D_2/D_3) \leq 10.0$.

* * * * *